US010177949B2

(12) United States Patent
Musselman (10) Patent No.: US 10,177,949 B2
(45) Date of Patent: Jan. 8, 2019

(54) COHERENT PHASE-SYNCHRONIZING CIRCUIT

(71) Applicant: The United States of America, as represented by the Secretary of the Air Force, Washington, DC (US)

(72) Inventor: Randall Lee Musselman, Colorado Springs, CO (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/667,661

(22) Filed: Aug. 3, 2017

(65) Prior Publication Data

US 2018/0062893 A1 Mar. 1, 2018

Related U.S. Application Data

(60) Provisional application No. 62/381,049, filed on Aug. 30, 2016.

(51) Int. Cl.
| | | |
|---|---|---|
| *H04L 27/227* | (2006.01) | |
| *H03L 7/107* | (2006.01) | |
| *H04J 1/06* | (2006.01) | |
| *H04L 27/14* | (2006.01) | |
| *H03L 7/097* | (2006.01) | |
| *H04L 27/148* | (2006.01) | |
| *G02F 1/1343* | (2006.01) | |
| *H03L 7/081* | (2006.01) | |

(52) U.S. Cl.
CPC ...... *H04L 27/227* (2013.01); *G02F 1/134336* (2013.01); *H03L 7/0812* (2013.01); *H03L 7/097* (2013.01); *H03L 7/107* (2013.01); *H04J 1/065* (2013.01); *H04L 27/142* (2013.01); *H04L 27/148* (2013.01)

(58) Field of Classification Search
CPC ... H04L 27/227; H04L 27/142; H04L 27/148; H03L 7/097; H03L 7/107; H04J 1/065
See application file for complete search history.

(56) References Cited

U.S. PATENT DOCUMENTS

| | | | | |
|---|---|---|---|---|
| 7,123,103 B1* | 10/2006 | Rosik | ........................ | H03L 7/07 331/45 |
| 2002/0031193 A1* | 3/2002 | Harrison | .............. | G11C 7/1072 375/340 |
| 2006/0076991 A1* | 4/2006 | Yoo | ...................... | H03D 13/004 327/158 |
| 2007/0080728 A1* | 4/2007 | Iwata | ........................ | H03L 7/07 327/156 |
| 2009/0256605 A1* | 10/2009 | Yoshizawa | ............ | H03L 7/0805 327/158 |

* cited by examiner

*Primary Examiner* — Jean B Corrielus
(74) *Attorney, Agent, or Firm* — AFMCLO/JAZ; Charles Figer, Jr.

(57) ABSTRACT

Embodiments of the invention provide advances in liquid-crystal technology for use as tunable phase-delay lines. The amount of phase delay through the liquid crystal is adaptively tuned, in order to coherently combine two signals, regardless of their phase differences. By adaptively adjusting the phase delays in the two signal paths, maximum coherent power combining is ensured. This ability to coherently combine the power of two signals regardless of their initial phase differences can greatly simplify, for example, antenna-diversity techniques used in MIMO applications as well as other applications.

7 Claims, 7 Drawing Sheets

COHERENT PHASE-SYNCHRONIZING CIRCUIT

CROSS-REFERENCE TO RELATED APPLICATIONS

This application claims the benefit of and priority to U.S. Provisional Application Ser. No. 62/381,049, entitled "Coherent Phase-Synchronizing Circuit," filed on Aug. 30, 2016, the entirety of which is incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to coherent phase-synchronizing circuits.

Description of the Related Art

There are many applications in communications receivers and microwave measurements that require synchronization between two signals. For example, multiple-input-multiple-output (MIMO) has become ubiquitous for wireless communications, in part due to diversity gain from the use of independent fading paths. Whether for polarization or spatial diversity, multiple antennas are used for such MIMO applications. From the perspective of the receiver, the signals received from multiple antennas must be combined in such a manner that improves reception compared to the use of a single antenna. A common method is to demodulate the signals that are received from each channel and choose the best signal based on some measured metric, such as signal-to-noise ratio (SNR), error statistics, etc., while discarding the other signal. However, better performance can be achieved by coherently combining the signals. This is typically done at baseband, requiring completely redundant down-conversion channels. If these signals could be coherently combined at the radio frequency (RF) rather than at baseband, the receiver would only require a single down-conversion channel.

Synchronous detection, used in many modern communications receivers, requires a phase-locked loop (PLL) in order to lock the phase of a received signal with that of the local oscillator, which is built into the receiver, or to coherently combine the signals as discussed above. However, contemporary PLL circuits require a voltage-controlled oscillator (VCO). But, a VCO is typically an active device that can be prone to phase noise. Accordingly, there is a need in the art to coherently combine signals without an active device.

SUMMARY OF THE INVENTION

Embodiments of the invention provide a coherent phase-synchronizing circuit that automatically synchronizes phases of two signals that are out of phase with each other, using liquid crystal as voltage-controlled delay lines. This circuit functions similarly to a phase-locked loop (PLL). However, this circuit locks two signals in phase without the need for a voltage-controlled oscillator (VCO), which is required for a PLL. This circuit automatically detects the difference in phase between two input signals, and uses this phase difference to apply voltages to two liquid-crystal delay lines. This applied voltage changes the relative permittivity (dielectric constant) of the liquid crystal, thus changing the propagation velocities of the signals through the liquid crystal. These voltage-controlled velocities simultaneously cause the leading signal to be delayed and the lagging signal to be advanced until their phases are matched. As long as the phases of the two signals are matched with each other, the voltage that is applied to the liquid crystal tends to equalize. If these voltages were allowed to become equal, the liquid-crystal velocities would also become equal, and the two signals would drift back to their original unequal phases. An integrator may be used to hold the applied voltage values that are required to maintain the equal phases. As with other stable control systems that use negative feedback, this circuit remains in a state of constant balance, as it self-adjusts the corrective voltages necessary for the liquid crystal to maintain phase synchronization. The two outputs, one for each of the phase-matched signals may be used independently, or combined in phase, with a power combiner. Embodiments of the invention assist in ensuring that any two signals with arbitrary phases would be combined in phase.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Polarization properties of liquid crystals allow for their use as tunable phase-delay lines for the purpose of coherently combining two signals with arbitrary phases. Applied DC voltages change the permittivity of the liquid crystal, which in turn changes the propagation delay. A feedback network can be constructed which adaptively increases the delay in the leading signal path, while simultaneously decreasing the delay in the lagging path. The two signals are brought in phase with each other, and then combined coherently in a power combiner.

Figure 1:
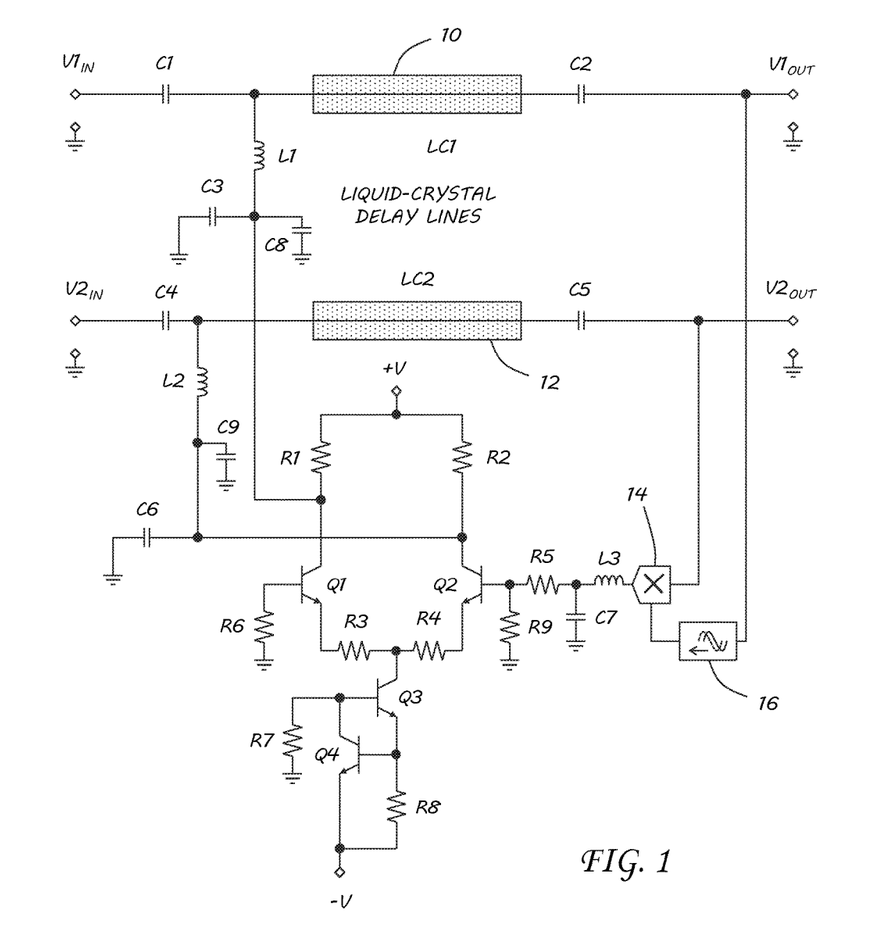
FIG. 1 is schematic of an exemplary embodiment a coherent phase-synchronizing circuit using voltage-controlled liquid-crystal delay lines.

Embodiments of the invention provide a coherent phase-synchronizing circuit that automatically synchronizes phases of two signals that are out of phase with each other, using liquid crystal as voltage-controlled delay lines. An exemplary embodiment, as shown in FIG. 1, include two delay lines LC1, LC2 through a liquid-crystal medium 10, 12. These delay lines consist of signal paths passing through the liquid crystal, which may be a co-planar waveguide, stripline, micros trip, or any other transmission line that passes through the liquid-crystal medium. The two input signals may be multiplied together using a mixer 14, which produces a phase-difference induced direct-current (DC) voltage, as well as a high-frequency voltage. Since only the DC term is used for phase detection, the high-frequency term may be eliminated with a simple passive low-pass filter, represented by L3 and C7 in FIG. 1. This DC voltage is applied to the base of transistor, Q2 in the differential-pair amplifier shown in FIG. 1. Alternatively, in some embodiments, a MOSFET version of this differential pair could also be used. The Q2 base voltage is compared with the base voltage of Q1, which is held to 0 Volts by the connection to ground. When the phases between the two signals are equal, the DC voltage at the output of the multiplier is 0 Volts, and there is no voltage difference between the two transistor inputs. As a result, the voltages applied to the two liquid-crystal delay lines are equal.

However, any difference in phase will cause the DC voltage at the multiplier output to either be positive or negative, depending on which phase is leading and which is lagging. The 90-degree phase shifter 16 in FIG. 1 makes this positive and negative voltage possible by creating the sine of the phase difference, rather than the cosine. This DC voltage causes an imbalance in the conduction of the two transistors, Q1 and Q2, causing one of the collector voltages to decrease and the other to increase. The signal path with the leading phase will propagate through the liquid-crystal delay line that has the increasing applied voltage. The higher applied voltage causes the liquid crystal to be more polarized, as shown by increasing θ in FIGS. 2A-2C, which increases its permittivity, ε thus decreasing the propagation velocity through this delay line. Simultaneously, the signal with the lagging phase propagates through the liquid-crystal delay line with the decreasing voltage, which causes the permittivity in the liquid crystal to decrease, thus increasing the propagation velocity through this delay line. Therefore, the leading signal is slowed as the lagging signal is advanced until they are brought into phase synchronization. At that point, the corrective voltage at the output of the multiplier returns to 0 Volts. Two integrators, in the form of passive low-pass filters (L1, C8 and L2, C9 in FIG. 1) hold the applied voltages that caused the two phases to be synchronized. These integrator voltages are constantly adjusted by the output voltages of the differential-pair amplifier, which are controlled by the correcting output voltage of the multiplier. Alternately, in some embodiments, active integrators using operational amplifiers may also be used for this purpose. Transistors, Q3 and Q4 are simply used as a current source for the differential pair in the illustrated embodiment.

Figure 2A:
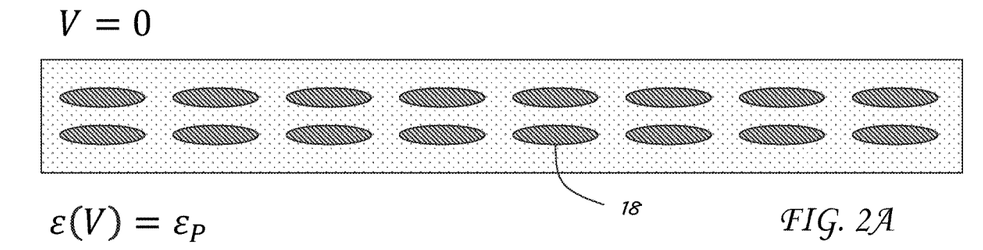
FIGS. 2A-2C are diagrams depicting a liquid crystal with parallel polarization (no applied voltage), a partial polarization, and transverse polarization (maximum applied voltage), respectively.
Figure 2B:
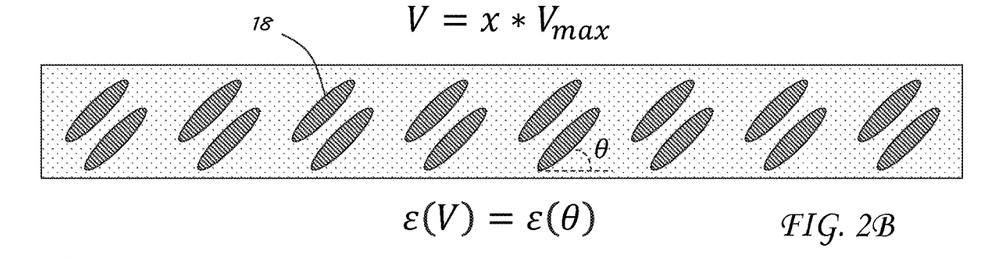
Figure 2C:
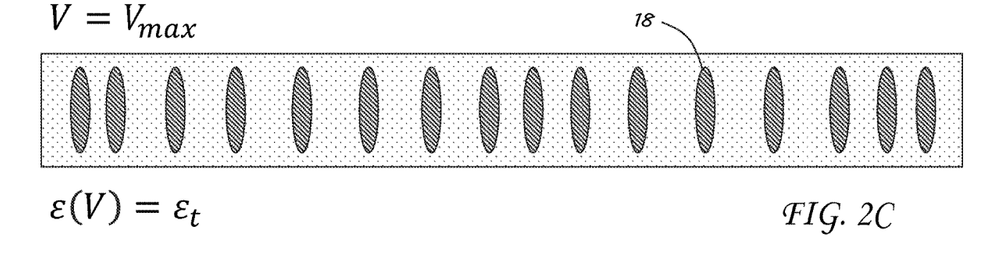

Nematic liquid crystals have been used in phase delay lines and may be used with embodiments of the invention, though other types of liquid crystals may also be used. FIGS. 2A-2C illustrate the polarization of liquid-crystal molecules 18, as an electric field is applied. By adaptively controlling the applied field, the polarization, and therefore permittivity, propagation velocity, and phase delay can be controlled. A simplified model for the orientation angle in FIGS. 2A-C can be written as $$\theta = \begin{Bmatrix} \frac{\pi}{2} - 2\tan^{-1}[e^{-(V-V_C)/V_0}] & V > V_C \\ 0 & V < V_C \end{Bmatrix} \quad (1)$$

where $V_C$ is the threshold voltage-per-micron of thickness that is required to begin orienting the liquid crystal, V is the applied voltage, and $V_0$ is a constant. The effective permittivity can be determined from $$\varepsilon_{\mathit{eff}} = \frac{\varepsilon_p \varepsilon_t}{\cos(\theta)^2 \varepsilon_t + \sin(\theta)^2 \varepsilon_p} \quad (2)$$

where $\varepsilon_p$ and $\varepsilon_t$ are the parallel (no applied field) and transverse (maximum applied field) permittivities, respectively. This difference in polarization yields a phase difference of $$\Delta \phi = \frac{2\pi}{\lambda} d \sqrt{\Delta \varepsilon_{\mathit{eff}}} \quad (3)$$

where $\Delta \varepsilon_{\mathit{eff}} = \varepsilon_{\mathit{eff}} - \varepsilon_p$ is the applied field-dependent change in permittivity, λ is the signal wavelength in a vacuum, and d is the length of the delay line. The phase response defined in equations (1)-(3) is represented by curve in FIG. 3 as phase in degrees vs. applied voltage with f=5 GHz, $V_0$=5, $V_c$=2, and d=5 cm.

Figure 4:
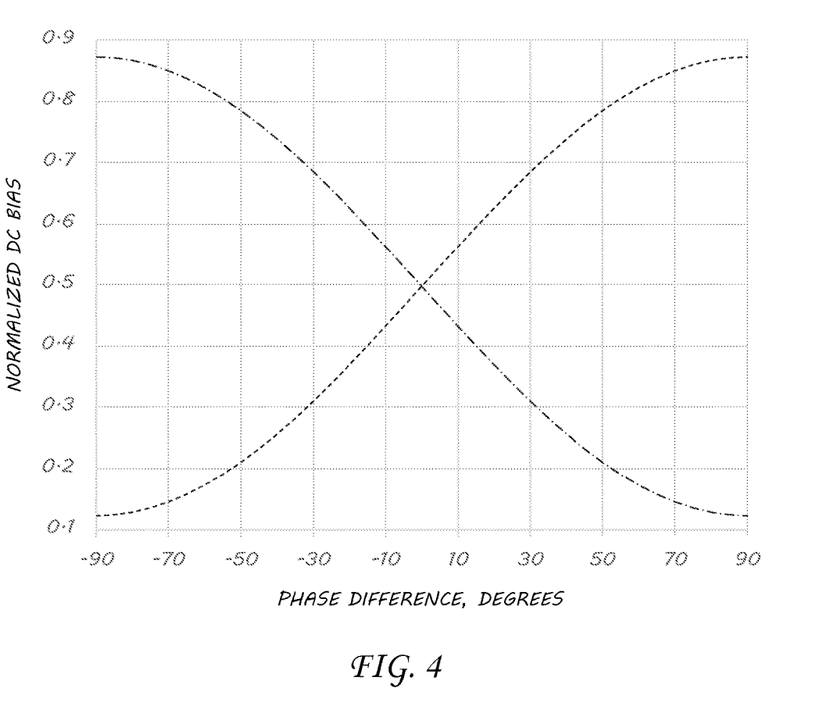
FIG. 4 is a graph of applied voltage vs. electrical phase delay of liquid crystal delay lines.
Figure 5A:
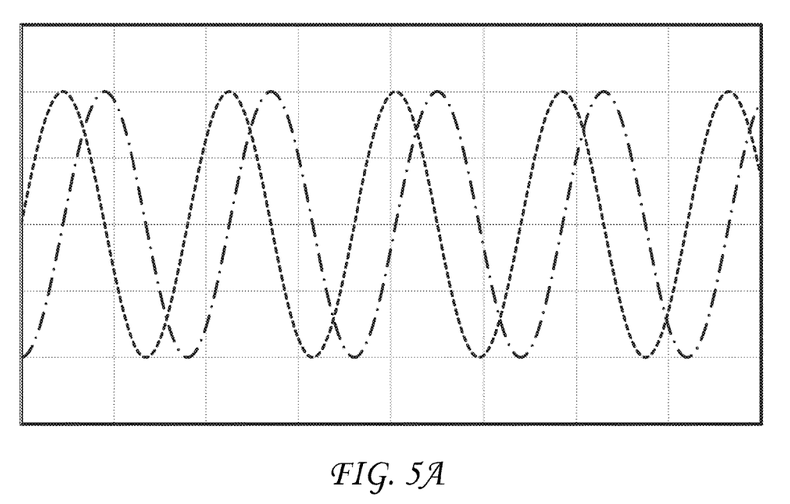
FIGS. 5A-5D are simulated outputs of two signals that are 90-degrees out of phase, as the liquid crystal delay-line circuit automatically brings them into phase synchronization at times of less than 0.5 ms, 2 ms, 3 ms, and 4 ms respectively.
Figure 5B:
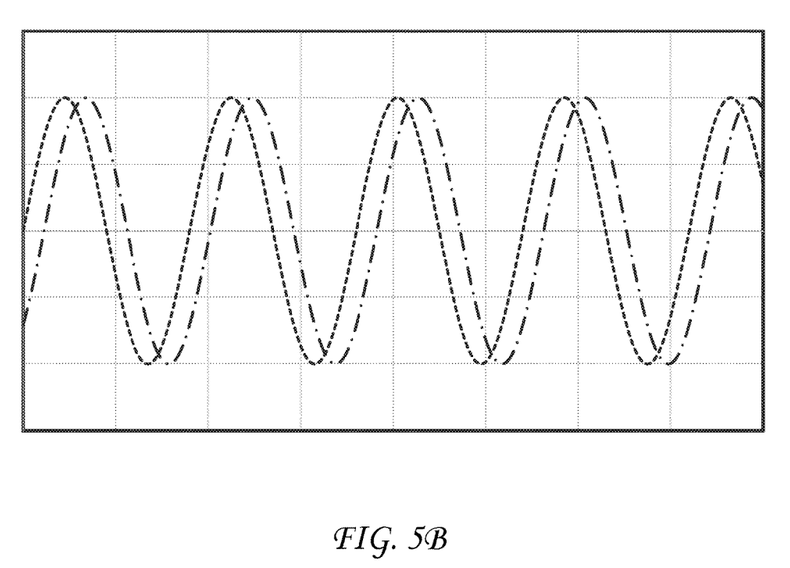
Figure 5C:
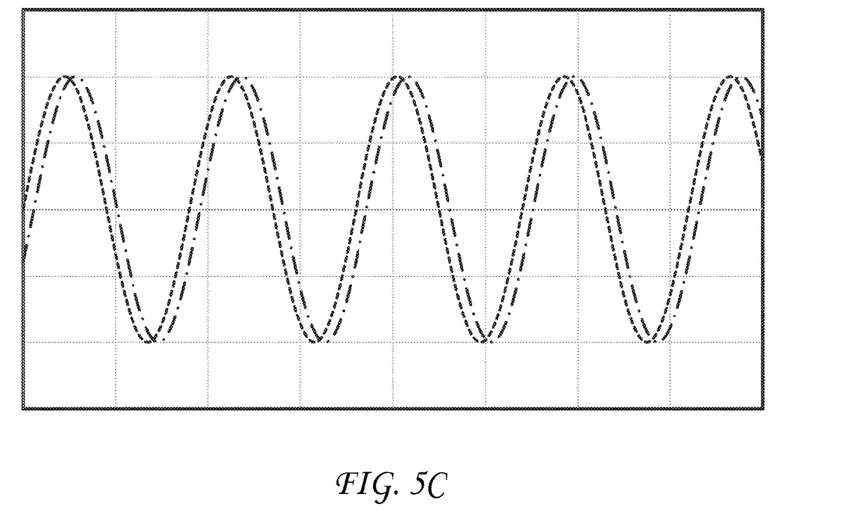
Figure 5D:
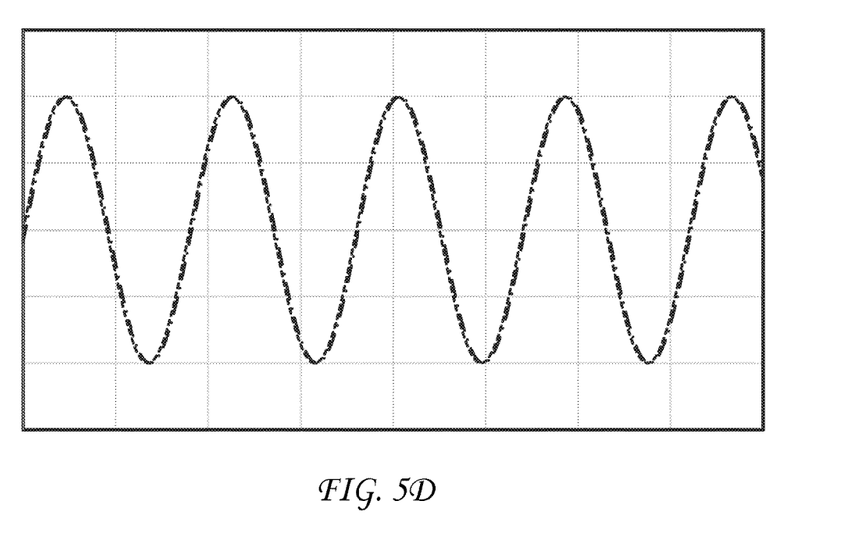

As set forth above, the applied DC voltage, required to tune the liquid crystal delay lines, can be supplied with the exemplary circuit in FIG. 1. This circuit detects the phase difference between two signal paths and creates opposing DC voltages based on the difference between the two phases. One of the directional coupler outputs are shifted by 90° in order to produce the multiplier output $$\sin(2\omega t - \phi) + \sin(\phi) \quad (4)$$

where φ is the phase difference between the two channels. Again, as set forth above, the left sinusoidal term in (4) is low-pass filtered, leaving only a DC voltage that is proportional to sin(φ) at the base of the right-most differential-amplifier transistor in FIG. 1. If there were no phase difference between the two signals, this DC term in (4) would be zero, and both diff-amp collector voltages would be equal, providing equal voltages to the two integrator inputs. As a result, the two liquid crystal delay lines would be equally biased. However, any phase difference would drive one of the differential-amplifier collectors high and the other low, reducing the delay in the lagging signal path, while increasing the delay in the leading path, following the transfer curves in FIG. 4. The purpose of the integrators is to hold those DC voltages as the mixer output returns to zero, due to the equalized phases. The common-emitter amplifiers scale the DC voltages to the required level in order for the liquid crystal to achieve ±90° of tuning range in both delay lines.

When one signal path leads the other, its applied DC voltage will be increased, increasing the permittivity of the liquid crystal, thus decreasing the phase velocity by $$v_p = \frac{c}{\sqrt{\varepsilon_{\it eff}}} \quad (5)$$

Figure 3:
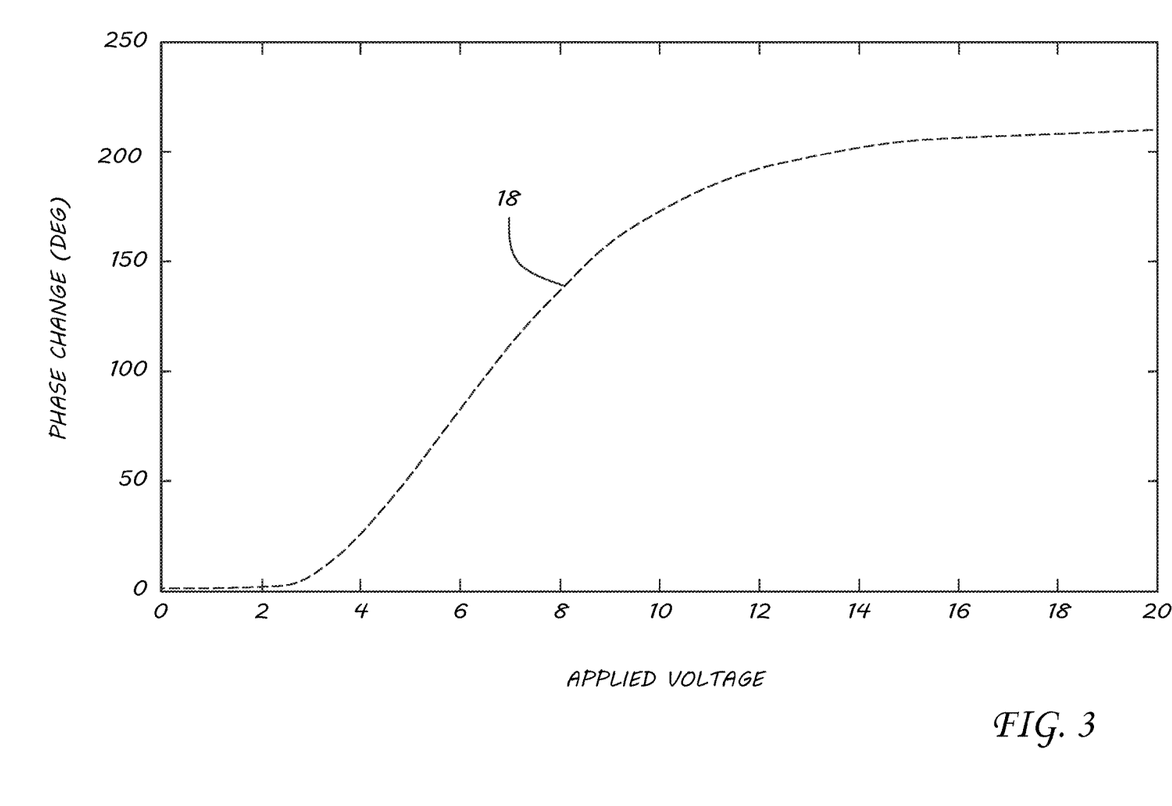
FIG. 3 is a graph of phase change.

As a result, the phase delay of this path will increase according to the phase vs. voltage relationship in FIG. 3. Simultaneously, the DC voltage that is applied to the opposite delay line will decrease, decreasing its permittivity, and thus decreasing the phase delay of the lagging path. As the leading signal is delayed and the lagging signal is advanced, the two signals are driven into phase and are coherently combined in, for example, a Wilkinson power combiner illustrate at the right in FIG. 1. As long as the two signals remain in phase, their respective delay lines will remain biased at these appropriate voltages, resulting in equal delay. Any phase drift will result in self-correcting DC biases.

It may be assumed for the embodiments of the invention that both channels have useable SNR. If one of the channels has unusable SNR, then the combiner would degrade the performance compared to the best channel. However, even such degradation of the combined signals would be preferable to only receiving one of the signals, if that received signal happened to be the one with the unusable SNR.

As proof of the circuit's functionality, this circuit was simulated using MULTISIM® by National Instruments. The table below provides the values of the circuit elements in FIG. 1 used for the simulation.

TABLE 1

Circuit Element Values

| | |
|---|---|
| C1 | 0.1 μF |
| C2 | 0.1 μF |
| C3 | 0.1 μF |
| C4 | 0.1 μF |
| C5 | 0.1 μF |
| C6 | 0.1 μF |
| C7 | 0.1 μF |
| C8 | 10 F |
| C9 | 10 μF |
| L1 | 10 mH |
| L2 | 10 mH |
| L3 | 10 mH |
| R1 | 1 kΩ |
| R2 | 1 kΩ |
| R3 | 0 Ω |
| R4 | 0 Ω |
| R5 | 10 Ω |
| R6 | 100 Ω |
| R7 | 1 kΩ |
| R8 | 50 Ω |
| R9 | 100 Ω |

$V1_{OUT}$ and $V2_{OUT}$ were determined across two 50Ω resistors. Since no MULTISIM® model yet exists for the voltage-controlled liquid-crystal delay lines, behavior models were created to convert applied voltage into time delay. FIGS. 5A-5D compare the two output signals ($V1_{OUT}$ and $V2_{OUT}$ in FIG. 1), over time (0 s, 0.4 ms, 2 ms, 3 ms, and 4 ms), as input, $V1_{IN}$ lags input, $V2_{IN}$ by 90 degrees. As FIGS. 5A-5D indicate, the two signals are automatically brought into phase within 4 ms of the start of the simulation.

An advantage of the embodiments of the invention utilizing this liquid-crystal phase-synchronizing circuit over a traditional PLL is the elimination of the need for a VCO, which is an active device. In contrast, the liquid-crystal delay line is passive, requiring no applied power. Since liquid crystal does not conduct electrical current, the voltage that is applied to the liquid crystal does not dissipate power. The only active components are in the differential-pair amplifier. The multiplier 14 may also be implemented with passive components.

Figure 6:
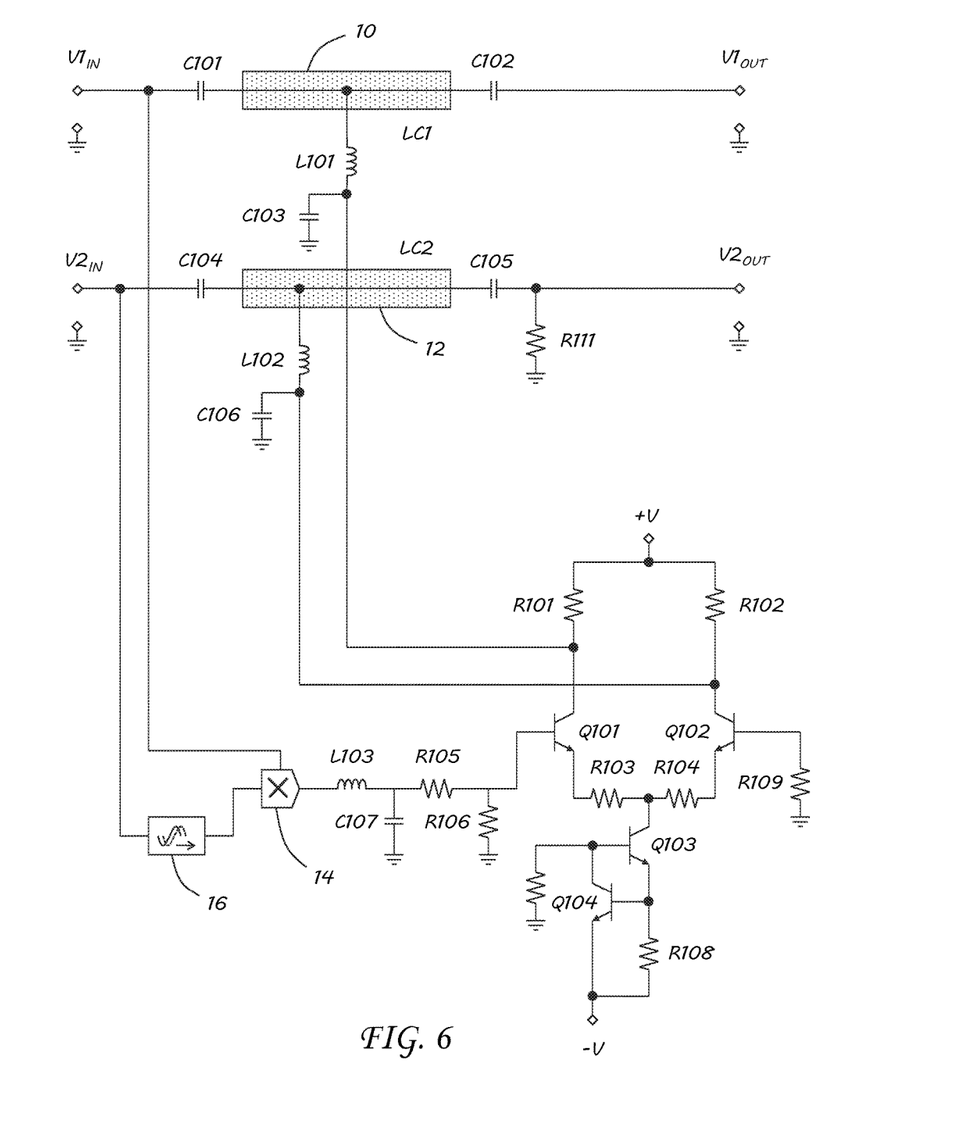
FIG. 6 is a schematic of an alternate open-loop embodiment of a coherent phase-synchronizing circuit using voltage controlled liquid-crystal delay lines.

The embodiment of the circuit in FIG. 1 uses a negative-feedback closed loop to lock the phases of the two signals together. An alternative configuration that may be implemented in other embodiments of the invention is to use an open-loop design, without feedback, such as the embodiment shown in FIG. 6. An advantage of this open-loop design is that it may be a simpler configuration to implement. However, the open-loop design may require more careful calibration of component values in order to achieve the same phase correction. An advantage of the closed-loop embodiment in FIG. 1 is that it is self-correcting. The closed-loop embodiment will automatically keep the phases locked, while adjusting for slight variations in component values, including manufacturing tolerances, temperature, etc.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A circuit for coherent phase-synchronization configured to automatically synchronize phases of a first signal and a second signal that are out of phase with respect to one another, the circuit comprising:

a first liquid crystal voltage-controlled delay line configured to receive the first signal and propagate the first signal to a first output;

a second liquid crystal voltage-controlled delay line configured to receive the second signal and propagate the second signal to a second output;

a mixer configured to multiply the first and second signals received from the first and the second outputs to produce a phase-difference induced direct current (DC) voltage;

a first transistor;

a second transistor;

a first integrator; and a second integrator, wherein the DC voltage produced by the mixer causes an imbalance in the conduction of the first and second transistors, and wherein the imbalance in the conduction causes a higher voltage of the imbalance to be applied to one of the first and second liquid crystal voltage-controlled delay lines thereby decreasing a propagation velocity through the one of the first and second liquid crystal voltage controlled delay lines, and wherein the imbalance in the conduction causes a lower voltage of the imbalance to be applied to the other of the first and second liquid crystal voltage-controlled delay lines thereby increasing a propagation velocity through the other of the first and second liquid crystal voltage-controlled delay lines, and wherein the first and second integrators are configured to hold the applied voltages to the respective first and second liquid crystal voltage-controlled delay lines.

2. The circuit of claim 1, wherein each of the first and second liquid crystal voltage-controlled delay lines comprises a signal path passing through each respective liquid crystal.

3. The circuit of claim 2, wherein each of the signal paths comprises a co-planar waveguide, stripline, microstrip, or any other transmission line that passes through a liquid-crystal medium.

4. The circuit of claim 1, wherein the mixer additionally produces a high-frequency voltage, the circuit further comprising:

a low pass filter configured to eliminate the high-frequency voltage.

5. A method for automatically synchronizing phases of a first and a second signal that are out of phase with respect to one another, the method comprising:

receiving the first signal by a first liquid crystal voltage-controlled delay line configured to propagate the first signal to a first output;

receiving the second signal by a second liquid crystal voltage-controlled delay line configured to propagate the second signal to a second output;

detecting a phase difference between the first signal and second signal received from the first and the second outputs;

applying an increasing voltage to one of the first or second liquid crystal voltage-controlled delay line to decrease propagation of the first or second signal based on the detected phase difference;

simultaneously applying a decreasing voltage to the other of the first or second liquid crystal voltage-controlled delay lines to increase propagation of the other of the first or second signal based on the detected phase difference; and holding voltage levels of the first and second liquid crystal voltage-controlled delay lines when the detected phase difference goes to zero.

6. A method for automatically synchronizing phases of a first signal and a second signal that are out of phase with respect to one another, the method comprising:

receiving the first signal by a first liquid crystal voltage-controlled delay line configured to propagate the first signal to a first output;

receiving the second signal by a second liquid crystal voltage-controlled delay line configured to propagate the second signal to a second output;

multiplying the first and second signals received from the first and second outputs with a mixer to produce a phase-difference induced direct current (DC) voltage, wherein the DC voltage produced by the mixer causes an imbalance in the conduction of a first and a second transistor;

applying a higher voltage of the imbalance to one of the first and second liquid crystal voltage-controlled delay lines thereby decreasing a propagation velocity through the one of the first and second liquid crystal voltage controlled delay lines;

applying a lower voltage of the imbalance to the other of the first and second liquid crystal voltage-controlled delay lines thereby increasing a propagation velocity through the other of the first and second liquid crystal voltage-controlled delay lines; and holding the applied voltages to the first and second liquid crystal voltage-controlled delay lines with a respective first and second integrator.

7. The method of claim 6, wherein the mixer additionally produces a high-frequency voltage, the method further comprising:

eliminating the high-frequency voltage with a low pass filter.

* * * * *